United States Patent [19]

Jun

[11] Patent Number: 5,625,208
[45] Date of Patent: Apr. 29, 1997

[54] METHOD FOR USING A CHARGE INJECTION TRANSISTOR

[75] Inventor: Young K. Jun, Seoul, Rep. of Korea

[73] Assignee: LG Semicon Co., Ltd., Chungcheongbuk-do, Rep. of Korea

[21] Appl. No.: 545,886

[22] Filed: Oct. 20, 1995

Related U.S. Application Data

[63] Continuation of Ser. No. 219,787, Mar. 30, 1994, abandoned.

[30] Foreign Application Priority Data

Mar. 4, 1994 [KR] Rep. of Korea ................. 4219/1994

[51] Int. Cl.$^6$ ........................................... H01L 29/76
[52] U.S. Cl. .................... 257/214; 257/321; 257/324; 257/325; 257/326; 257/327; 257/405; 257/645; 257/651
[58] Field of Search ..................... 257/214, 321, 257/324, 327, 405, 325, 326, 645, 651

[56] References Cited

U.S. PATENT DOCUMENTS

| | | | |
|---|---|---|---|
| 3,500,142 | 3/1970 | Kahng | 257/324 |
| 4,047,974 | 9/1977 | Harari | 257/324 |
| 4,115,914 | 9/1978 | Harari | 257/321 |

OTHER PUBLICATIONS

Sze, *Physics of Semiconductor Devices*, 2nd Edition, 1981, pp. 504–506 and 510.
Paper Entitled "*Semiconductor Devices Physics and Technology*" (pp. 187–221) by S.M. Sze (AT&T Bell Laboratories), Published by John Wiley & Sons Copyrighted in 1985.

*Primary Examiner*—Edward Wojciechowicz
*Attorney, Agent, or Firm*—Morgan, Lewis and Bockius LLP

[57] ABSTRACT

A charge or carrier injection transistor including a substrate, a gate electrode and an electric potential barrier layer forming an electric potential barrier against charges (either holes or electrons) injected by the gate electrode towards the substrate. A source and a drain are formed in the substrate on opposite sides of the gate electrode. A conduction channel, between the source and the drain, is formed on the substrate by charges passing through the electric potential barrier by a voltage applied to the gate electrode. When the applied voltage is removed, this channel disappears. That is, the transistor is ON when the charges from the gate electrode pass through the electric potential barrier and is OFF when no charges pass through it, thereby the charges perform a transistor switching function.

22 Claims, 5 Drawing Sheets

METHOD FOR USING A CHARGE INJECTION TRANSISTOR

CROSS REFERENCE TO RELATED APPLICATION

This is a continuation of application Ser. No. 08/219,787, filed Mar. 30, 1994, now abandoned.

FIELD OF THE INVENTION

This invention relates to transistors of a semiconductor integrated circuit, more particularly to carrier injection transistors suitable for prevention of thermal degradation of characteristics.

BACKGROUND OF THE INVENTION

Following the trend of manufacturing lighter, thinner, shorter and smaller integrated circuits, scale-down of elements for improving degree of integration is under way.

To meet the micronization of element, technologies for forming thin junctions and thin insulation films operable under low voltage is required for forming transistors.

Consequently, even a common MOSFET (Metal On Semiconductor Field Electron Transistor), due to the decrease of gate width following adoption of LDD (Lightly Doped Drain) structure, exhibits defects like short channel effect showing both decrease of threshold voltage and weakening of punch through characteristic, and increased leakage current due to DIBL (Drain Induced Barrier Lowering) showing lowered voltage barrier between a source diffusion layer and a substrate by an electric field of drain.

Therefore, as a solution about these defect, substrate engineering which could protect threshold voltage and sub threshold characteristics while maintaining surface temperature by forming high density impurities as a punch through stopper inside of the substrate where drain depletion regions would develop, is under way.

On the other hand, problems of thermal degradation of element characteristics by hot carrier effects in which electrons are injected into a gate oxide film due to increased average energy of electrons and sudden elevation of electron temperature due to a horizontal direction electric field on a channel near drain.

To prevent such hot carrier effects, it is necessary to increase the density of low density impurity regions(n-) in a LDD structure to improve current driving capacity while relieving the electric field, but, because in which case short channel effects increase significantly, it is difficult to satisfy both suppressing short channel effects and improving current driving capacity on the same time.

Such a foregoing conventional transistor is to be explained hereinafter, referring to attached drawings.

Figure 1:
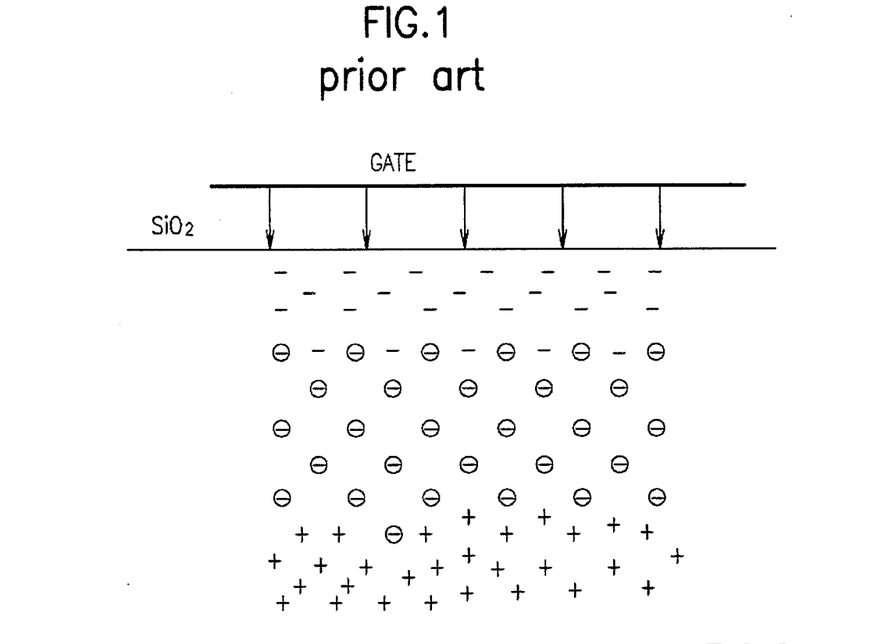
FIG. 1 explains an inversion layer forming in a channel region of a conventional transistor.
Figure 2A:
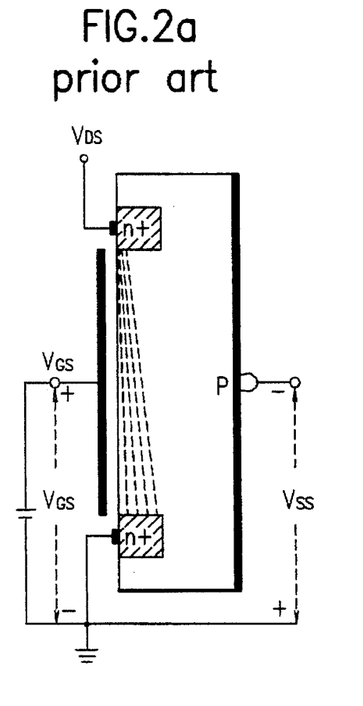
FIG. 2 explains relations of drain voltage with a conduction channel of a conventional transistor.
Figure 2B:
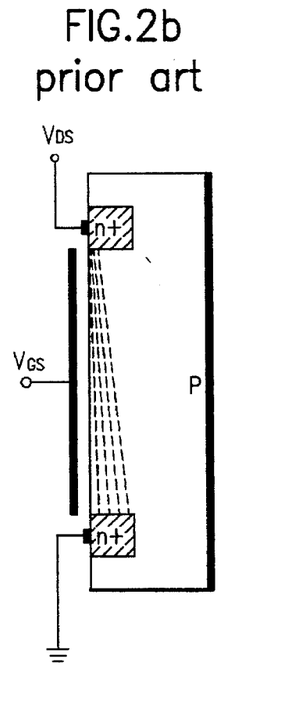
Figure 2C:
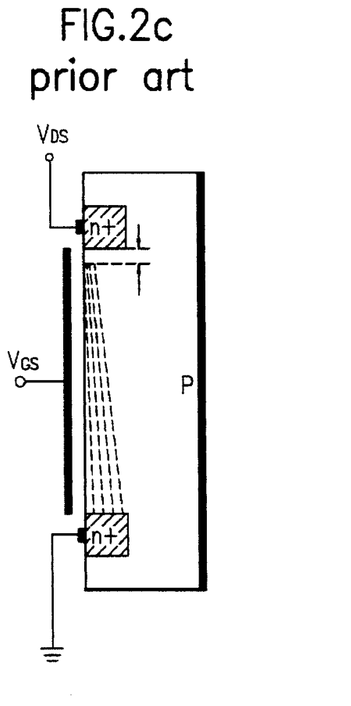
Figure 3:
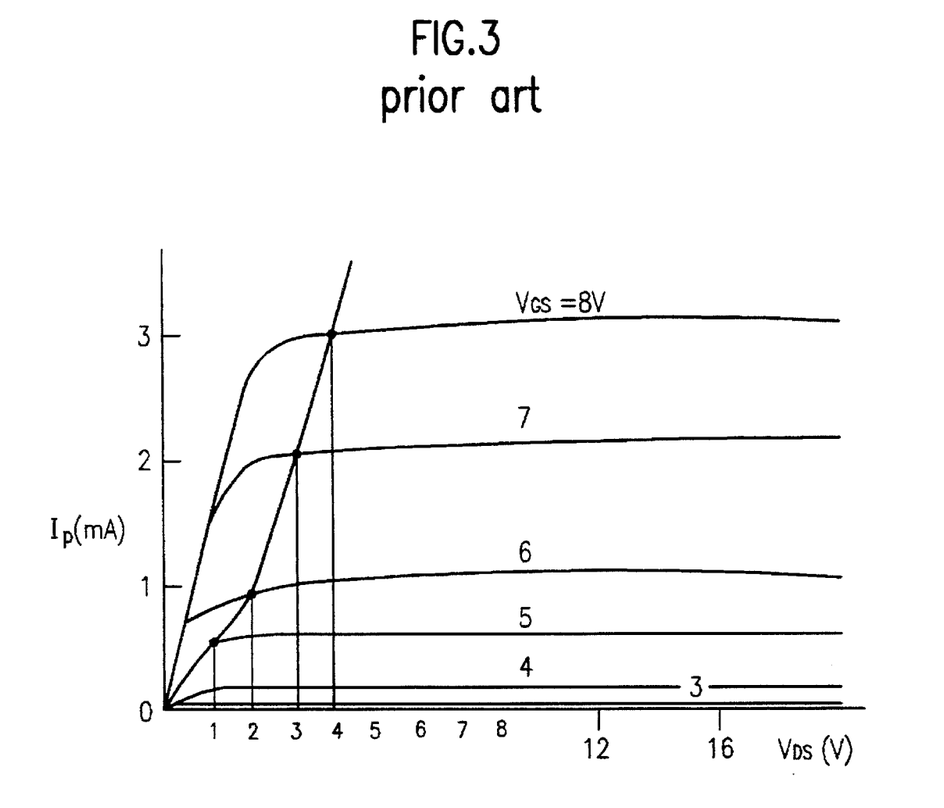
FIG. 3 shows characteristic curves of a conventional enhancement type n channel MOSFET.

FIG. 1 explains an inversion layer formation in a channel region of a conventional transistor, FIGS. 2a–2c explain in of a relation of drain voltage and a conduction channel of a conventional transistor, and FIG. 3 shows characteristic curves of a conventional enhancement type n-type MOSFET, wherein a structure of a conventional enhancement type n-type transistor, as shown in FIG. 1, includes high density n type impurity regions having high impurity density, each connected to a source pole and a drain pole, and formed in a certain interval on a p-type silicon substrate having low impurity density and resistivity of 1 to 10 $\Phi$/cm, a thin gate insulation film(oxide film) of about 200 Angstroms thick covering, the surface of the p-type silicon substrate between the high density n-type impurity regions, and gate poles of polysilicon film or layers of polysilicon films and silicide films formed on the gate insulation film.

Operation of a conventional thin film transistor having foregoing construction is to be explained hereinafter.

Referring to FIG. 1, when positive voltage is applied on a gate pole, because an electric field is concentrated on within the gate insulation film the resistance of the gate insulation film is much greater than the resistance of semiconductor.

Therefore, the electric field formed the positive voltage applied on the gate pole, pushing holes being minority carriers and pulling electrons, is converted into a n-type region in which the electrons out number the holes on the surface of p-type silicon substrate, inducing an inversion layer.

That is, an electron layer forms a conduction channel between a drain region and a source region, being a high density n-type impurity regions.

A gate voltage required to cause such a conduction channel is called threshold voltage.

Shown in FIGS. 2a–2c are a conversion into a conduction channel when a gate voltage and a drain voltage are applied, wherein a voltage between the gate pole and source VGS is supposed to be kept to a constant value higher than the threshold voltage VT, the electric potential difference between the p-type silicon substrate and source is VSS, and the electric potential difference between the source and the drain is VDS. Shown in FIG. 2(a) is when the VDS is relatively low at VSS=0, wherein, because the conduction channel width of the source side corresponds to VGS and the conduction channel width of the drain side corresponds to VGS-VDS, it can be known that the conduction channel width of the drain side becomes narrower than the conduction channel width of the source side.

Shown in FIG. 2(b) is when the conduction channel of the drain side is pinched-off, wherein VGS–VDS=VT, therefore VDS=VGS–VT(VSS=0) in pinch-off.

And shown in FIG. 2(c) is beginning of forming of a depletion region between the drain and the conduction channel when the VDS exceeds the pinch-off voltage, wherein, because resistance of a depletion region is much more greater than the resistance of a conduction channel, the excessive voltage ((VDS—VDS)(pinch-off) exceeding the pinch-off is applied to the depletion region along the interface, therefore, though the depletion region increases following the elevation of VDS, a drain current ID substantially maintains the same value.

That is, shown in FIG. 3 is current-voltage characteristics of an enhancement type n-channel MOSFET, wherein, though VDS is elevated, the drain current is of a saturated current.

However, the foregoing conventional transistors lave had problems of having a deterioration of operative characteristic and a drop of reliability of a transistor due to drop of threshold voltage, weakening of punch through characteristic and increase of leakage current due to increase of short channel effects and hot carrier effects by the shortened conduction channel between a source and a drain following the decrease of size of a transistor according to the progress of high integration of semiconductor element.

SUMMARY OF THE INVENTION

The object of this invention designed to solve foregoing problems is to stabilize operative characteristics and to improve reliability of transistors.

This and other objects and features of this invention can be achieved by providing a carrier injection transistor including a gate for injecting carriers, an electric potential barrier layer between the gate and the substrate and, serving as an electric potential barrier against the carriers injected by the gate and a conduction channel region forming on the substrate by the carriers having passed through the electric potential barrier layer.

DETAILED DESCRIPTION OF THE INVENTION

Carrier injection transistors in accordance with this invention is to be explained more in detail hereinafter, referring to the attached drawings.

Figure 4:
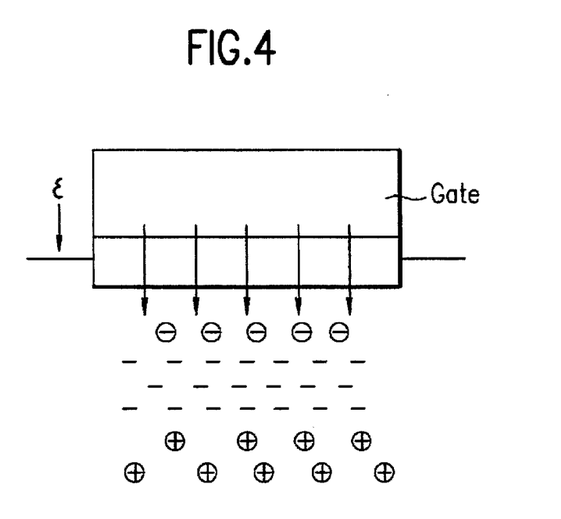
FIG. 4 explains forming of a conduction channel by a gate injection in accordance with this invention.
Figure 4A:
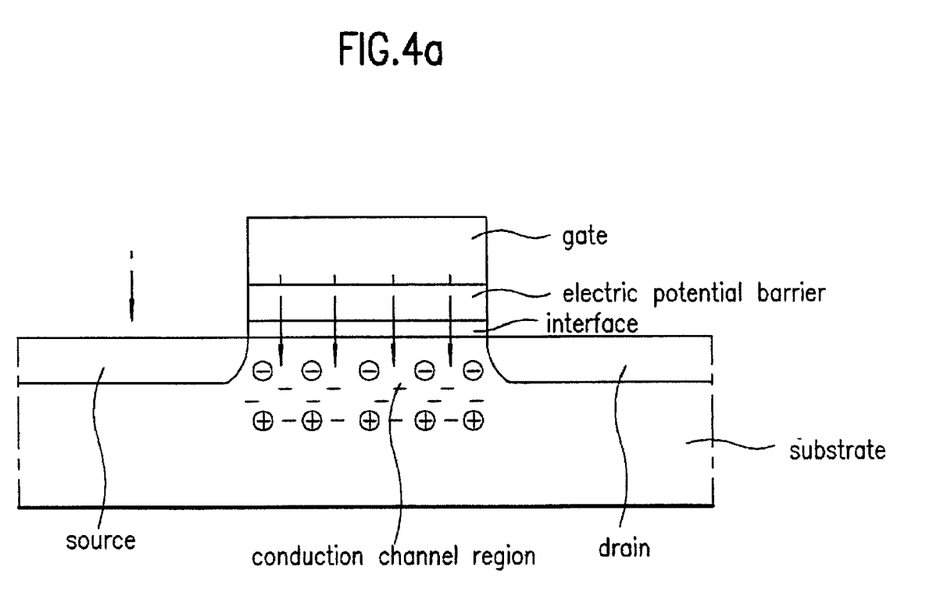
FIG. 4a is a drawing similar to FIG. 4 and further explains this invention.
Figure 5:
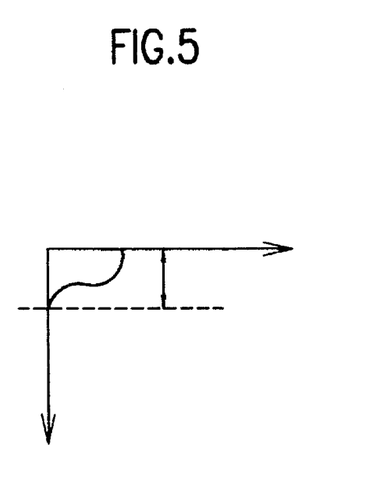
FIG. 5 shows a diffusion distance distribution of injected electrons according to FIG. 4.

FIG. 4 shows a section of a transistor explaining forming of a channel by carrier injection in accordance with this invention and FIG. 5 shows a diffusion distance of injected electrons in accordance with FIG. 4.

As shown in FIG. 4, forming of a conduction channel of a transistor in a carrier injection transistor in accordance with this invention is carried out, instead of forming an inversion layer by attracting small number of carriers onto a surface of a substrate by the effect of an electric field, after setting up an electric potential barrier between a gate pole and a substrate, electric or photo energy is applied to a gate pole so that carriers are injected through the electric potential barrier layer from the gate pole into the substrate.

Thus, the conduction channel of a transistor is formed by forming an inversion layer having a width corresponding to a diffusion distance of carriers injected into a substrate. As for the electric potential barrier against the injection of minority carriers, an insulation film or method of setting up of an interface state is used.

Shown in FIG. 6 is a section of a transistor for explaining a carrier injection transistor in accordance with a first embodiment of this invention, showing a case wherein an electric potential barrier is formed using an insulation film between a gate pole and a substrate, and having a gate pole applied with electric energy so that carriers make tunneling through the insulation film into the substrate, resulting in minority carriers injected into the substrate.

That is, a vertical structure of a gate, an insulation film and a substrate has a form of n-type/intrinsic/p type diode, and a silicon oxide(SiO2) film is used as the insulation film.

Figure 6A:
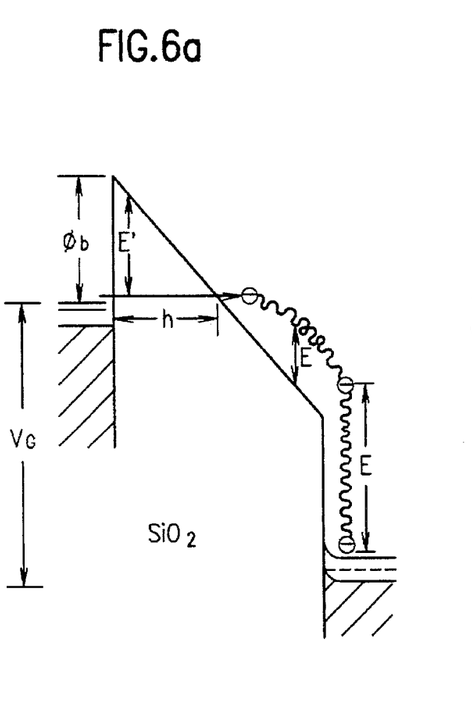
FIG. 6 explains a gate injection transistor in accordance with a first embodiment of this invention.
Figure 6B:
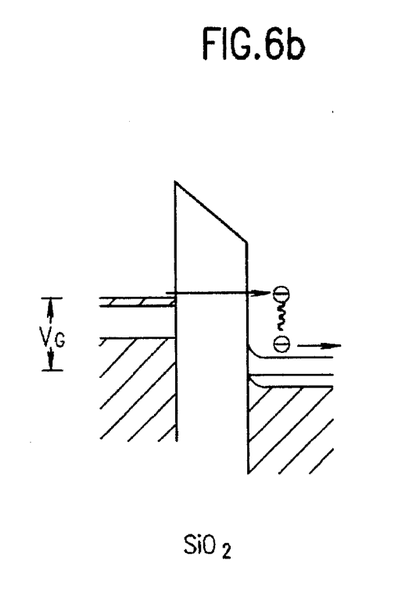

And forming of a conduction channel by tunneling, depending on the principle of electrons, as minority carriers, passing through a silicon oxide(SiO2) film into a substrate, can be divided into the Fowler-Nordheim tunneling(FIG. 6(a)) and the direct tunneling.(FIG. 6(b)).

The Fowler-Nordheim tunneling shown in FIG. 6(a) prevails in case the silicon oxide(SiO2) film is relatively thick and the voltage applied to the gate pole is relatively high.

The direct tunneling shown in FIG. 6(b) prevails in case the thickness of the silicon oxide film is relatively thin, below 40 to 50 Angstroms, and the voltage applied to the gate pole is relatively low. In general, required conditions for tunneling is follows;

1. Carriers should exist in a permissible energy state at one side of a tunneling barrier from which tunneling initiates.
2. Empty permissible energy state should exist at the other side into which the carriers tunneling.
3. Overall energy and momentum should be conserved in tunneling injection.
4. The tunneling probability of carriers should not be little.

From above conditions, it can be known that, to improve the tunneling probability, it is necessary to make the width of a transition region narrower into which the tunneling injection initiates and, therefore, a control in the direction of making the width of tunneling electric potential barrier and energy band banding of the semiconductor layer near the interface adjacent to the tunneling electric potential barrier narrower.

One way to achieve the foregoing is to use n-type semiconductors as gates doped with high density impurities or to use materials with low resistance such as metals or metal silicide.

And as for the way to form an artificial empty permissible energy state, the second condition of the required condition for tunneling, a method for forming an energy band of impurities by-injecting impurity ions which can form a energy state into an energy band gap of the substrate semiconductor can be used.

In FIG. 6a, E' represent the difference of energy of tunnel electrons and the conduction band of the silicon oxide film(SiO2), and E represents the difference of energy of the tunnel electrons and the conduction band of the substrate semiconductor. And $\Phi b$ is height of tunnel barrier of electrons against a tunneling barrier and h is a tunneling distance.

The principle of tunneling is, when an electric field is established at a silicon oxide(SiO2) film, the tunneling distance of the silicon oxide(SiO2) film to a conduction band becomes shorter as the strength of the electric field becomes greater, which makes tunneling probability increase rapidly so that, at last, electrons initiate tunneling into an energy state of the silicon oxide(SiO2) film conduction band and moves toward the substrate semiconductor along the direction of the electric field.

In the Fowler-Nordheim tunneling, tunneling electrons are accelerated by an electric field set-up at a silicon oxide(SiO2) film, which hot electrons being accelerated electrons also being affected by the scattering of phonons, to form an energy distribution corresponding to the electric field, that consequently, affects the diffusion distance of the injection electrons, settling the channel width.

On the other hand, in the direct tunneling, as the incident waves of the tunneled electrons and the reflected waves of the electrons reflected at a tunneling barrier and a substrate semiconductor have interferencing effects, the channel width, ie., the diffusion distance of the injection electrons can be affected, accordingly.

Figure 7:
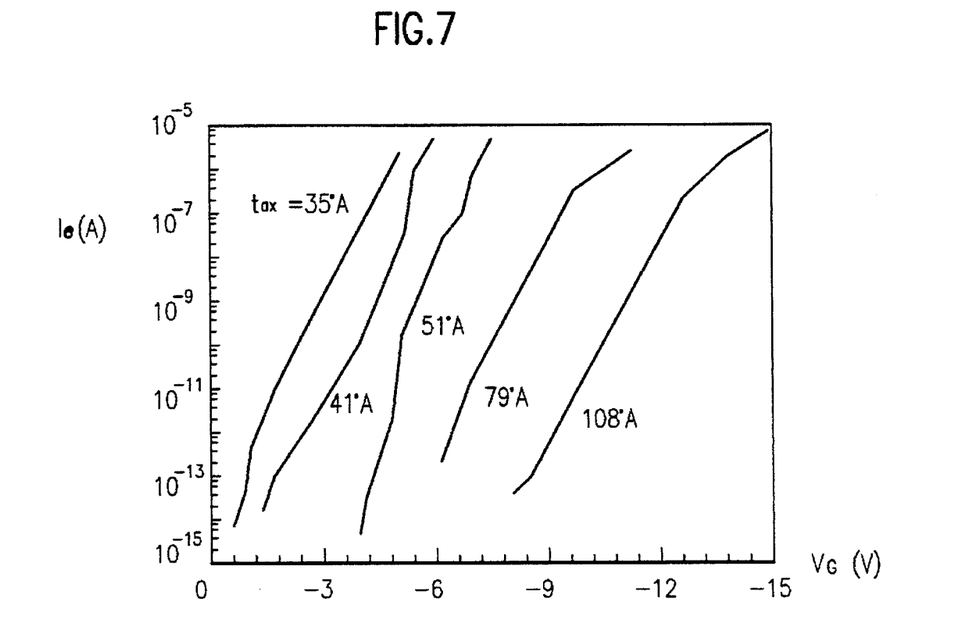
FIG. 7 shows reliance of gate current on gate voltage in accordance with FIG. 6.

FIG. 7 shows, when a gate pole and a substrate is formed in a closed circuit, the dependency of gate current IG on gate voltage VG according to the variation of the thickness of a gate insulation film(silicon oxide film), wherein it can be known that, as the thickness of the insulation thickness decreases, the Fowler-Nordheim tunneling transits to the direct tunneling.

Though what has been explained until now is about the forming of a conduction channel by injecting electrons through an insulation film from a gate pole in a transistor an electric potential barrier has been formed therein as an insulation film between the gate pole and a substrate, a conduction channel can be formed by injecting holes.

The difference in this time lies on the decrease of tunneling probability because the height of the electric potential barrier of holes being to 3.8 eV is greater than the electric potential barrier of electrons being to 3.0 eV.

Figure 8:
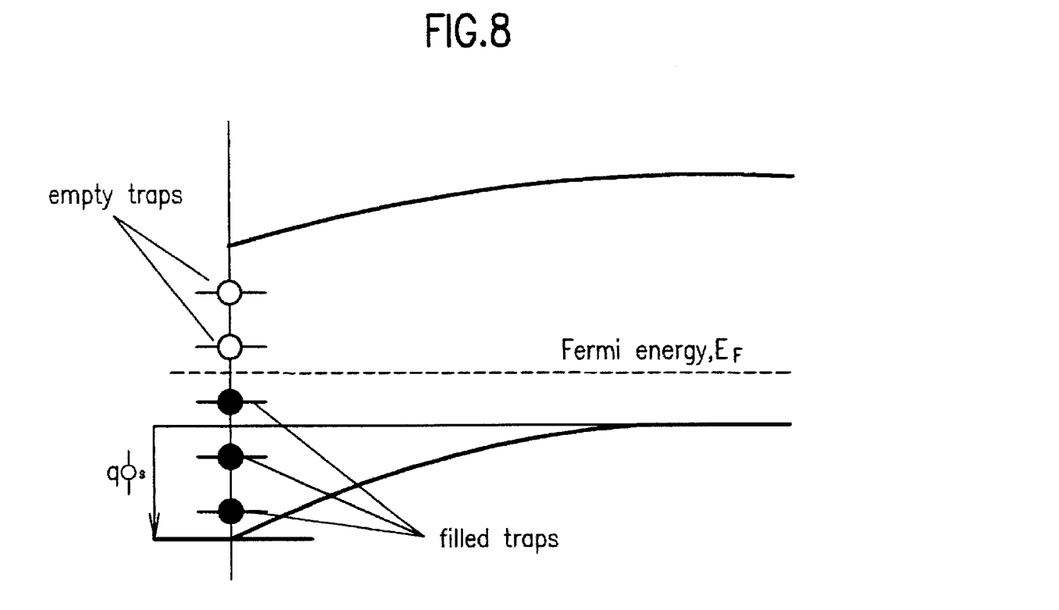
FIG. 8 explains a gate injection transistor in accordance with a second embodiment of this invention.

Meantime, FIG. 8 explains a carrier injection transistor in accordance with a second embodiment of this invention, wherein a field emission method is., forming of a conduction channel by carrying out injection of carriers into a substrate by the field emission set-up on application of electric energy to a gate pole, is shown.

That is, the qΦs shown in FIG. 8 represents an energy band banding on the surface of substrate semiconductor, at the interface of a silicon oxide(SiO2) film an a semiconductor substrate, by setting up of an interface state having a new energy state within a forbidden energy band gap of the semiconductor substrate, the.electrons captured by the interface state are discharged depending on the condition of the electric field to transfer to the conduction channel of the semiconductor substrate. As for the method of forming the interface state, methods of injecting impurity ions such as ions of Cu, Ag, Mn, Co, Ni, Pt and Cr into the interface layer of a silicon oxide film and a semiconductor substrate or introducing the impurities ions into the interface layer by heat treatment under an atmosphere containing the impurities ions, can be used.

Figure 9:
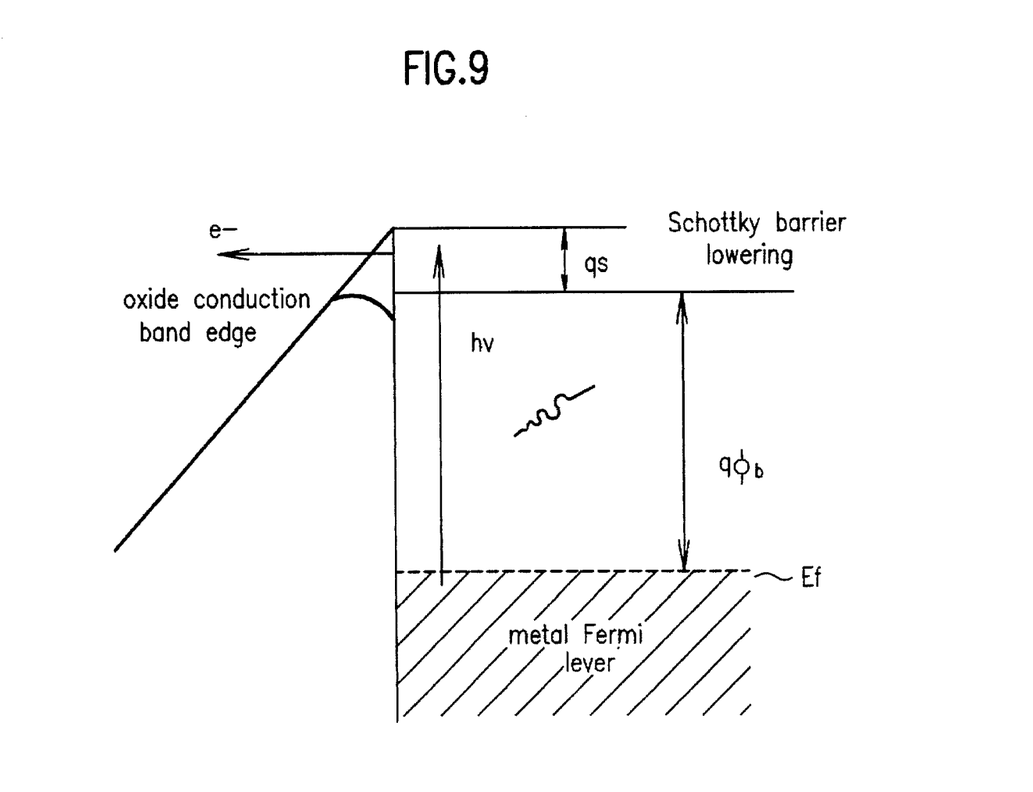
FIG. 9 explains a gate injection transistor in accordance with a third embodiment of this invention.

Meantime, FIG. 9 explains a carrier injection transistor in accordance with a third embodiment of this invention, wherein a photo emission method, ie., a method in which electrons are forced to pass through an electric potential barrier to be injected into a substrate by applying photo energy on a gate pole, is shown.

That is, in FIG. 9, q s is an electric potential barrier, Ef is an electron energy state, and hv is photo energy, wherein, in a metal/oxide film/semiconductor(MOS) structure, when photos are absorbed adjacent to the surface of metal or a semiconductor, electrons are excited enough to be transferred to the conduction channel of an oxide film.

For example, in a construction of metal/oxide film/ semiconductor, in case the metal is aluminum and the semiconductor is silicon, both are put together with the oxide film, ultraviolet rays having 3 to 5 eV is required.

Though the holes can be injected by means of photo emission, in this case, it has a disadvantage of happening of injection of electrons into the opposite electric pole on the same time.

In this time, the injection of electrons can be prevented effectively by providing a recombination ceufer through setting-up of an impurity energy state thereby the injected electrons can be removed by recombination.

The foregoing carrier injection transistors in accordance with this invention have following advantages.

A decline of reliability and deterioration of operative characteristics following the reduction of element size experienced in field effect transistors can be prevented because of forming of a conduction channel by means of carrier injection.

That is, the operative characteristics of transistors can be stable because forming of a conduction channel can be performed by applying a higher critical voltage or a higher critical energy than required for passing through a barrier irrespective of the reduction of elements by controlling the height and width of a potential barrier or by controlling an interface state distribution.

What is claimed is:

1. A method for using a charge injection transistor including a substrate having an electric potential barrier layer, a gate on the electric potential barrier layer, and source and drain regions at opposite sides of the gate in the substrate, said method comprising the steps of:

forming a conduction channel in the substrate between the source and the drain regions by passing charges through the electric potential barrier layer and injecting the charges into the substrate using a voltage applied to the gate, in order to form a current path between the source and the drain regions; and removing the conduction channel, in order to cut off the current path between the source and the drain regions by no charges passing through the electric potential barrier layer.

2. The method for using a charge injection transistor as claimed in claim 1, wherein the charges perform a transistor switching function.

3. The method for using a charge injection transistor as claimed in claim 1, wherein the conduction channel is formed by the charges tunneling through an insulation film positioned between the gate and the substrate.

4. The method for using a charge injection transistor as claimed in claim 1, wherein the conduction channel is formed by injecting charges into the substrate by a field emission.

5. The method for using a charge injection transistor as claimed in claim 1, wherein the conduction channel is formed by forcing electrons through the electric potential barrier and injecting the electrons into the substrate by applying photo energy to the gate.

6. The method for using a charge injection transistor as claimed in claim 1, wherein the conduction channel is removed when the voltage applied to the gate is removed.

7. The method for using a charge injection transistor as claimed in claim 1, wherein the charges comprise electrons.

8. The method for using a charge injection transistor as claimed in claim 1, wherein the charges comprise holes.

9. The method for using a charge injection transistor as claimed in claim 1, wherein upon setting up a tunneling barrier as the electric potential barrier layer, the charges perform tunneling to form a conduction channel region in the substrate.

10. The method for using a charge injection transistor as claimed in claim 9, wherein the tunneling barrier is formed to perform direct tunneling.

11. The method for using a charge injection transistor as claimed in claim 9, wherein the tunneling barrier is formed to perform Fowler-Nordheim tunneling.

12. The method for using a charge injection transistor as claimed in claim 9, wherein an insulation film is used as the tunneling barrier.

13. The method for using a charge injection transistor as claimed in claim 12, wherein a silicon oxide film is used as the insulation film.

14. The method for using a charge injection transistor as claimed in claim 1, wherein upon setting up of an emission barrier as the electric potential barrier, the charges perform emission to form a conduction channel region n the substrate.

15. The method for using a charge injection transistor as claimed in claim 14, wherein a field emission is used.

16. The method for using a charge injection transistor as claimed in claim 15, wherein the field emission step comprises setting up of an interface state having an energy state in a forbidden energy band gap of the substrate;

and discharging captured electrons in the interface state to be injected into the substrate.

17. The method for using a charge injection transistor as claimed in claim 16, wherein the setting up of an interface state is formed by ion injection of metal impurities into an interface between the substrate and the electric potential barrier.

18. The method for using a charge injection transistor as claimed in claim 17, wherein at least one of Cu, Ag, Mn, Co, Ni, Pt and Cr are used as metal impurity ions.

19. The method for using a charge injection transistor as claimed in claim 16, wherein the setting tip of the interface state comprises introducing impurity ions into an impurity interface layer by heat treatment under an atmosphere of metal impurity.

20. The method for using a charge injection transistor as claimed in claim 19, wherein at least one of Cu, Ag, Mn, Co, Ni, Pt and Cr are used as metal impurity ions.

21. The method for using a charge injection transistor as claimed in claim 14, wherein a photo emission is used.

22. The method for using a charge injection transistor as claimed in claim 1, wherein a conduction channel region includes a carrier channel between a source and a drain, which is formed by applying a voltage to the gate and which disappears when the applied voltage is removed.

* * * * *

UNITED STATES PATENT AND TRADEMARK OFFICE
CERTIFICATE OF CORRECTION

PATENT NO. : 5,625,208
DATED : April 29, 1997
INVENTOR(S) : JUN

It is certified that error appears in the above-identified patent and that said Letters Patent is hereby corrected as shown below:

Column 7, Line 4, change "n" to --in--.

Column 8, Line 2, change "tip" to --up--.

Signed and Sealed this

Fifth Day of October, 1999

Q. TODD DICKINSON

*Attest:*

*Attesting Officer*   *Acting Commissioner of Patents and Trademarks*